United States Patent [19]
Miyata

[11] 4,015,212
[45] Mar. 29, 1977

[54] AMPLIFIER WITH FET HAVING GATE LEAKAGE CURRENT LIMITATION

[75] Inventor: Toshihiko Miyata, Tokyo, Japan

[73] Assignee: Sony Corporation, Tokyo, Japan

[22] Filed: Oct. 28, 1975

[21] Appl. No.: 626,370

[30] Foreign Application Priority Data

Oct. 31, 1974  Japan .................. 49-125875

[52] U.S. Cl. .................. 330/13; 330/15; 330/22; 330/24; 330/35

[51] Int. Cl.² .................. H03F 3/16

[58] Field of Search .......... 330/13, 15, 22, 33 D, 330/35, 38 M, 40, 24

[56] References Cited
UNITED STATES PATENTS

| | | | |
|---|---|---|---|
| 3,626,825 | 12/1971 | Years | 330/35 X |
| 3,810,031 | 5/1974 | Poujois | 330/35 X |
| 3,887,881 | 6/1975 | Hoffmann | 330/13 X |
| 3,921,089 | 11/1975 | Tsurushima | 330/35 X |

OTHER PUBLICATIONS

Altman, "IC On Amp Has C-Mos Output," Electronics, Sept. 19, 1974, pp. 133, 135.

Primary Examiner—James B. Mullins
Attorney, Agent, or Firm—Lewis H. Eslinger; Alvin Sinderbrand

[57] ABSTRACT

An amplifier having at least a drive stage and an output stage, the output stage comprised of an FET for applying an amplified signal to a load. The drive stage includes a transistor device whose output is direct coupled to the gate electrode of the FET, the transistor device being supplied with an input signal to be amplified. A constant current source is coupled to the output of the transistor device, and thus to the gate electrode of the FET, and provides a current of predetermined magnitude to thus limit the gate leakage current during periods that the FET is cut off.

22 Claims, 5 Drawing Figures

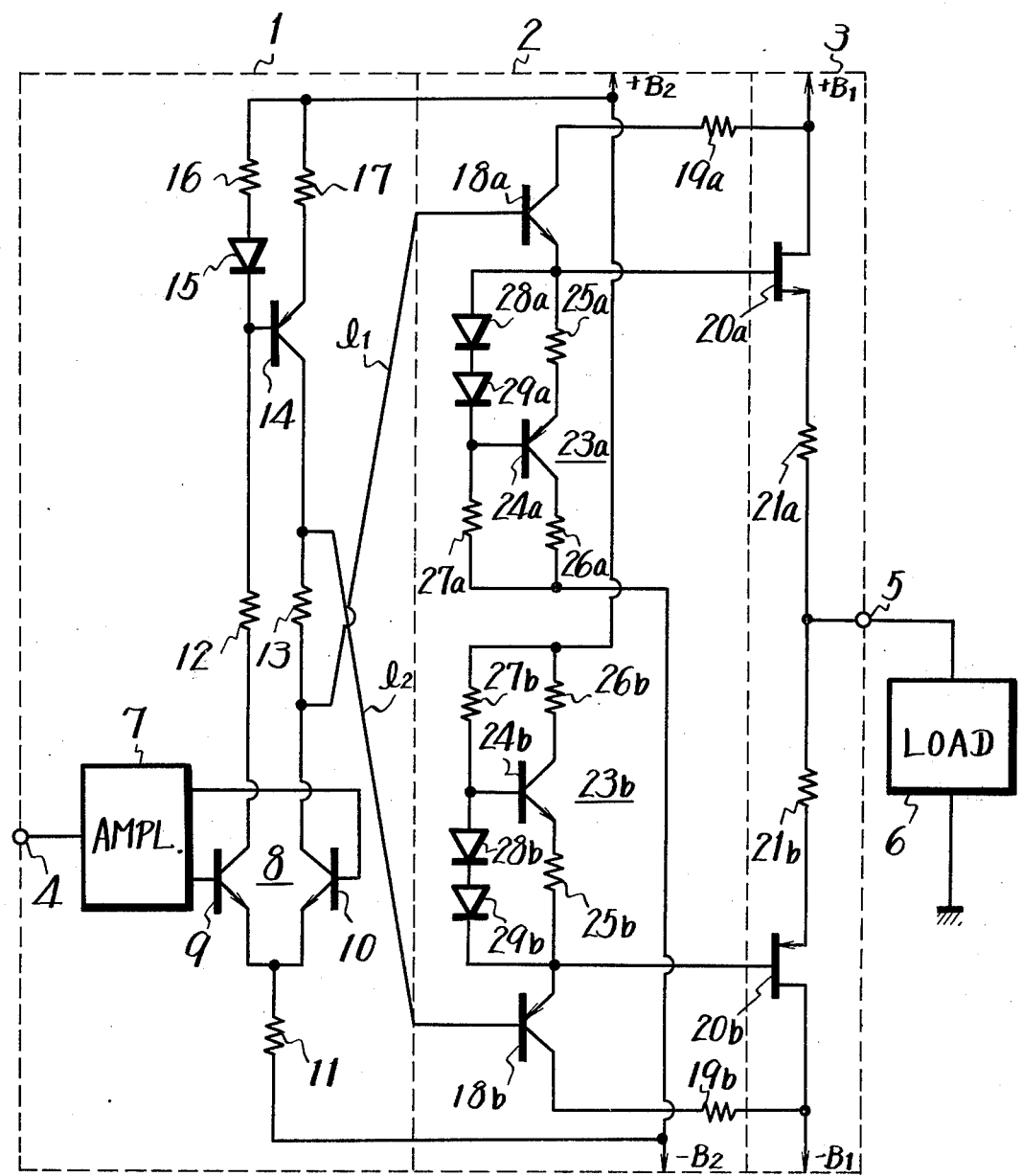

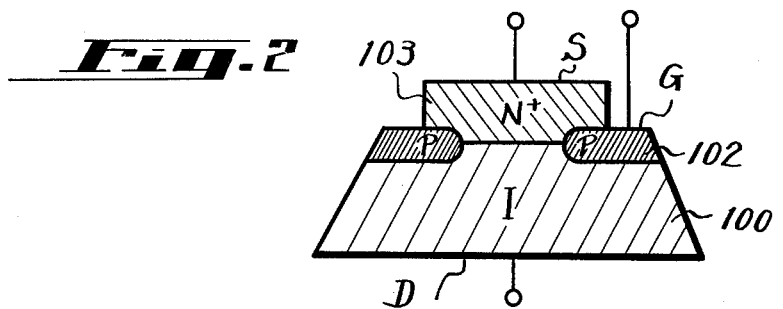
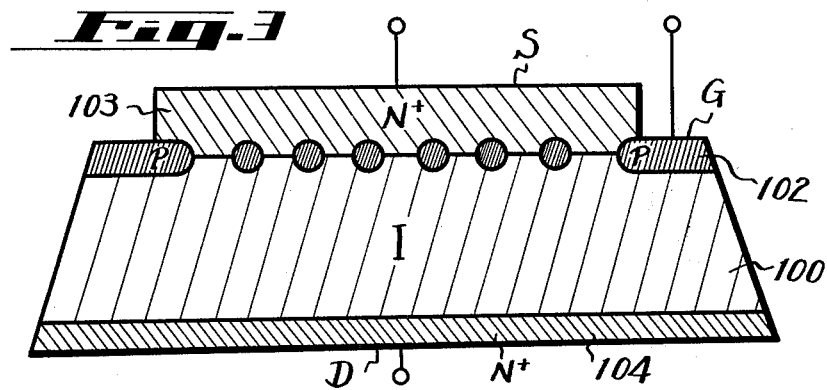
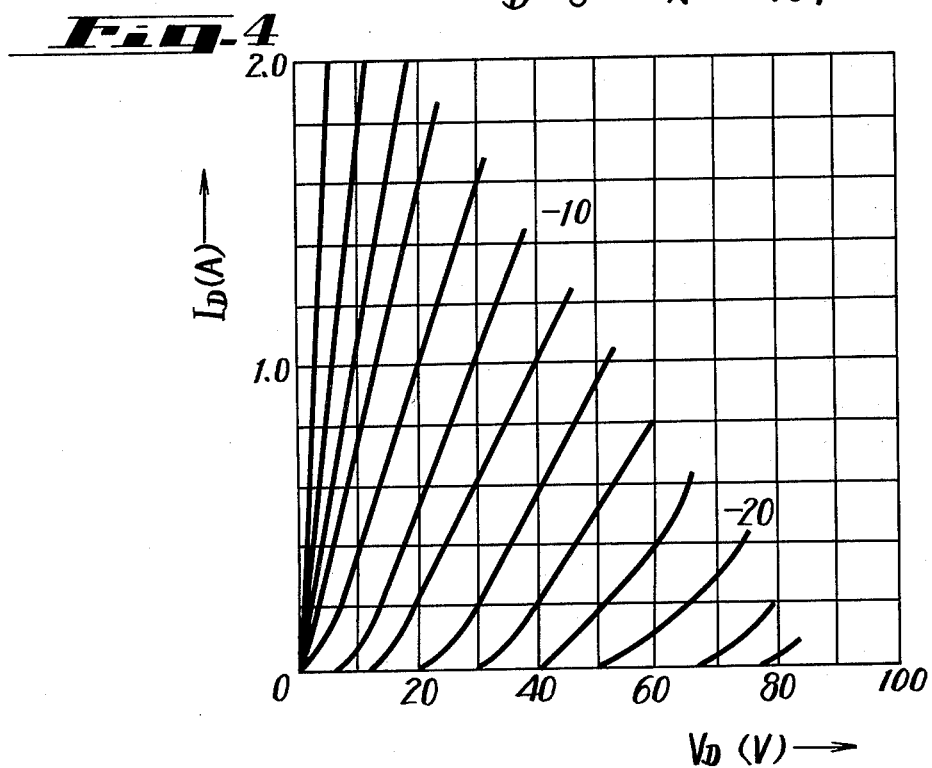

AMPLIFIER WITH FET HAVING GATE LEAKAGE CURRENT LIMITATION

BACKGROUND OF THE INVENTION

The present invention is directed to an improvement in an amplifier of the type which includes at least a drive stage and an output stage and, more particularly, to such an amplifier wherein a field effect transistor is included in the output stage.

A typical type of amplifier which is used for audio signals is comprised of a drive stage and an output stage directly coupled to the drive stage. That is, the coupling between the drive and output stages is not frequency sensitive and, typically, may comprise merely a conductor, a resistor or a bias source. Hence, both DC and AC signals can be applied through this direct coupling. In amplifiers of this type, the final element in the drive stage is comprised of an emitter-follower transistor device, and this device is direct coupled to, for example, the gate electrode of a field effect transistor (FET) which is included in the output stage, and which generally is connected to the load which is driven. In one example, the load is driven by a push-pull output stage formed of two complementary FET's; and these FET's are driven by complementary emitter-follower transistor devices. Thus, the FET's may be driven in complementary symmetry that permits push-pull amplification, advantageously without the use of a transformer.

While the emitter-follower devices in the drive stage may be formed of complementary transistor devices so as to properly drive the FET's, the emitter loads for these emitter-follower devices generally consist of a load resistor. Since the FET's are driven in complementary symmetry whereby first one and then the other is turned on, or rendered conductive, this resistor load provides a current path for the gate leakage current of that particular FET which is turned off. This leakage current is on the order of several to ten microamps. With this current flowing through the emitter load resistor, a corresponding voltage potential is produced thereacross and which functions as a gate bias voltage. In some instances, this bias voltage is sufficient to drive the turned off FET into conduction. Since the FET which should be nonconductive is, instead, conducting, the complementary symmetry is upset and the output signal applied to the load exhibits undesired distortion. Moreover, there is the possibility that the gate bias voltage may reach sufficient magnitudes whereby the FET is subjected to substantial damage, and may even be destroyed. This is especially pronounced when a signal of large amplitude is applied to the output stage.

OBJECTS OF THE INVENTION

Therefore, it is an object of the present invention to provide an improved amplifier wherein the field effect transistor which is included in the output stage that is directly coupled to the drive stage has its gate leakage current limited to a predetermined amount when the field effect transistor is cut off.

Another object of this invention is to provide an improved amplifier of the type having a drive stage and a directly coupled output stage, wherein the output stage includes at least one field effect transistor and the drive stage includes an emitter-follower transistor device having a constant current circuit as the load.

A further object of this invention is to provide an improved amplifier wherein the aforenoted problems of output signal distortion and damage to the amplifier components are avoided.

An additional object of this invention is to provide an improved amplifier of the type having a drive stage and a direct coupled output stage having at least one field effect transistor, wherein the gate voltage of the field effect transistor is controlled.

Yet another object of this invention is to provide an improved amplifier comprised of at least one field effect transistor which is disposed to drive a load in source-follower or drain-follower configuration, while exhibiting a substantially stabilized gate voltage.

A still further object of the present invention is to provide an improved transistor amplifier of relatively simple circuit construction and which is particularly adapted to be used as a high quality audio power amplifier.

Various other objects and advantages of this invention will become apparent from the ensuing detailed description, and the novel features will be particularly pointed out in the appended claims.

SUMMARY OF THE INVENTION

In accordance with this invention, an amplifier is provided with a drive stage and an output stage, the output stage including a field effect transistor which is connected to supply an amplified signal to a load; the drive stage is provided with a transistor device which is supplied with the signal to be amplified and which is direct coupled to the gate electrode of the field effect transistor in emitter-follower configuration; and a constant current circuit is connected to the transistor device as an emitter load so as to provide a current of predetermined magnitude and thereby to limit the gate leakage current of the field effect transistor when that field effect transistor is cut off.

For the purpose of the present discussion, a transistor device may be a transistor, such as an npn or pnp transistor, a field effect transistor, or an equivalent device. Some examples of equivalent transistor devices are silicon controlled rectifiers, gate controlled switches, bidirectional switches, as well as other such devices. In addition, the transistor device may be an active element which is capable of performing a function similar to that described by the aforementioned devices. Some examples of such an active element include solid state devices as well as vacuum tube devices, gas discharge devices, and the like. Hence, it should be readily understood that when a particular electrode of a transistor device is described in the following description, this description also will apply to equivalent electrodes in the foregoing transistor and equivalent devices.

BRIEF DESCRIPTION OF THE DRAWINGS

The following detailed description, given by way of example, will best be understood in conjunction with the accompanying drawings in which:

FIG. 1 is a schematic diagram illustrating one embodiment of a transistor amplifier in accordance with the teachings of the present invention;

FIG. 2 is a sectional view of one embodiment of a field effect transistor having triode-type dynamic characteristics which may be used with the present invention;

FIG. 3 is a sectional view of another embodiment of a field effect transistor which may be used with the present invention;

FIG. 4 is a graphical representation illustrating typical dynamic characteristics of a field effect transistor having triode-type dynamic characteristics.

DETAILED DESCRIPTION OF CERTAIN ONES OF THE PREFERRED EMBODIMENTS

Figure 5:
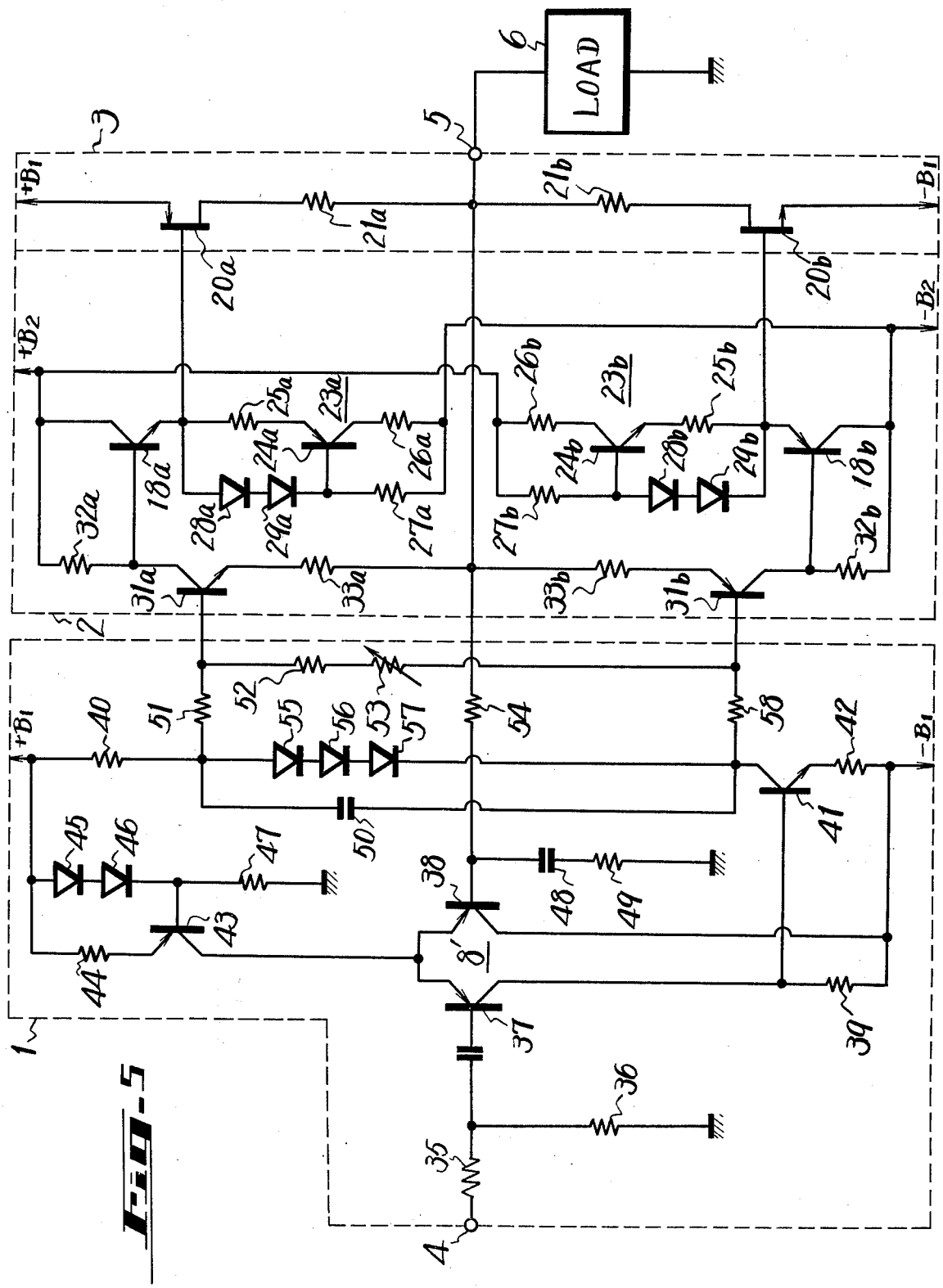
FIG. 5 is a schematic diagram illustrating another embodiment of a transistor amplifier in accordance with the teachings of the present invention.

Referring now to the drawings, wherein like reference numerals are used throughout, and in particular to FIG. 1, there is illustrated a schematic representation of an amplifier in accordance with one embodiment of the present invention. The illustrated embodiment is comprised of an input stage 1 formed of a Class-A amplifier, a drive stage 2 and an output stage 3, the output stage being formed of a Class-B or Class-AB amplifier. The illustrated amplifier, comprising the input stage, the drive stage 2 and the output stage 3 is readily adapted for use in audio signal amplifier applications whereby an input audio signal is amplified and is supplied to an output terminal 5 so as to drive a load 6, such as a loudspeaker system.

In its Class-B or Class-AB configuration, the output stage 3 is formed as a complementary Class-B or Class AB push-pull amplifier, and is comprised of an N-channel FET 20a and a P-channel FET 20b. These FET's are driven in complementary symmetry such that when one is cut off, the other is conducting. In the illustrated configuration, the FET's 20a and 20b are connected through the output terminal 5 to the load 6 in source-follower configuration. Accordingly, the drain electrode of the FET 20a is connected to a DC power supply and, preferably, to the positive terminal $+B_1$ of such a DC power supply. Similarly, the drain electrode of the FET 20b is connected to the negative terminal $-B_1$ of the DC power supply. The respective source electrodes of the FET 20a and 20b are connected through the source load resistors 21a and 21b to the amplifier output terminal 5. As shown, the respective gate electrodes of these FET's are direct coupled to the drive stage 2.

The drive stage 2 is comprised of complementary transistor devices 18a and 18b which are direct coupled to the respective FET's 20a and 20b in emitter-follower configuration so as to drive the FET's in push-pull relation. Accordingly, the transistor device 18a may comprise an npn transistor whose control, or base electrode is supplied with a signal to be amplified and whose collector electrode is connected to a limiting resistor 19a to the positive terminal $+B_1$ of the DC power supply. Similarly, the transistor device 18b may comprise a pnp transistor whose control, or base, electrode is supplied with the signal to be amplified and whose collector electrode is connected through a limiting resistor 19b to the negative terminal $-B_1$ of the DC power supply. It is seen that, since the transistors 18a and 18b are connected as emitter-followers, their respective emitter electrodes are direct coupled to the gate electrodes of the FET's 20a and 20b, respectively.

In accordance with the present invention, the gate leakage current of the respective FET's are limited when the FET is driven to cut off by constant current circuits which are connected as emitter loads to the transistors 18a and 18b. Thus, a constant current circuit 23a is connected to the emitter electrode of the transistor 18a and a constant current circuit 23b is connected to the emitter electrode of the transistor 18b. In a preferred embodiment thereof, each of the constant current circuits is formed of a transistor whose base electrode is supplied with a constant bias voltage by a suitable constant voltage device. More particularly, the constant current circuit 23a is comprised of a pnp transistor 24a whose emitter electrode is connected through a resistor 25a to the emitter electrode of the transistor 18a (and thus, to the gate electrode of the FET 20a) and whose collector electrode is connected through a collector resistor 26a to a source of operating potential. Preferably, the operating potential which is supplied to the transistor 24a is derived from the negative terminal $-B_2$ of a second DC power supply. The collector resistor 26a functions as a limiting resistor for protection and thus exhibits a relatively low resistance value. Optionally, the resistor 26a may be omitted.

The constant voltage circuit which is used to provide a constant base bias voltage for the transistor 24a is formed of series-connected diodes 28a and 29a which are connected to the base electrode 24a and are poled in the direction to permit emitter current of the transistor 18a to flow therethrough. Alternatively, the diodes may be replaced by varistors, if desired. In addition, the base biasing circuit is completed by a resistor 27a which is connected in series between the diodes 28a, 29a and the negative terminal $-B_2$ of the second DC power supply. In this fashion, the diodes are forward biased so as to permit current to flow from the emitter electrode of the transistor 18a, through the diodes and through the resistor 27a to the second DC power supply. The forward bias drop across the diodes, which is substantially constant, is applied as a constant base bias voltage to the transistor 23a.

The constant current circuit 23b is of similar construction and thus includes a transistor 24b whose collector-emitter circuit is connected to the emitter electrode of the transistor 18b in a series circuit constituted by the positive terminal $+B_2$ of the second DC power supply, an optional collector resistor 26b of relatively low resistance, and an emitter resistor 25b. The substantially constant base bias voltage which is applied to the transistor 24b is produced by the constant bias circuit formed of the diodes 28b and 29b which are connected in series with a resistor 27b, this series circuit being interconnected between the second DC power supply and the emitter electrode of the transistor 18b so that the diodes are forward biased. As shown, in addition to being connected to the emitter electrode of the transistor 18b, the constant current circuit 23b also is connected to the gate electrode of the FET 20b and serves to limit the gate leakage current of this FET when the FET is cut off.

If it is assumed that the forward bias drop across each of the diodes 28a, 29a, 28b and 29b is, for example, 0.6 volts, and if it is further assumed that the base-emitter voltage drop for each of the transistors 23a and 23b also is 0.6 volts, then it is appreciated that the constant current which is determined by each of the constant current circuits 23a and 23b is equal to 0.6 volts (the voltage across each of the emitter resistors 25a and 25b) divided by the resistance value of the emitter resistor. The magnitude of this constant current is set to be greater than the gate leakage current of the respective FET's 20a and 20b.

The input stage 1, connected as a Class-A amplifier, is comprised of a first differential amplifier 7 and a second differential amplifier 8, the second differential amplifier being connected so as to be differentially driven by the differential amplifier 7. The first-mentioned differential amplifier 7 is of conventional construction and is adapted to receive an input signal applied to the input terminal 4. The differential amplifier 8 preferably is comprised of differentially-connected transistors 9 and 10 whose common-connected emitter electrodes are connected through a common load resistor 11 to the negative terminal $-B_2$ of the second DC supply. The collector electrode of the transistor 9 is connected to the positive terminal $+B_2$ of the second DC supply through a load resistor 12 and then through a bais circuit formed of a diode 15 connected in series with a resistor 16. This bias circuit serves to apply a base bias voltage to a transistor 14 whose collector-emitter circuit is connected in series with the collector electrode of the transistor 10. More particularly, the transistor 14, which may be a pnp transistor, has its emitter electrode connected through a resistor 17 to the second DC supply and has its collector electrode connected through a resistor 13 to the collector electrode of the transistor 10. It may be appreciated that the transistor 14 functions as a constant current source.

The respective voltages produced across the resistor 13 are individually supplied to the complementary transistor devices 18a and 18b by the conductors $l_1$ and $l_2$, as shown. Hence, the complementary transistors are driven in complementary symmetry by the voltage generated across the resistor 13 by the differential amplifier 8. In this manner, the transistor devices 18a and 18b are alternately rendered conductive so that they can be considered to be driven in alternate, opposite phases to each other.

Before describing the operation of the amplifier schematically illustrated in FIG. 1, reference now is made to FIG. 2 which depicts a sectional view of one example of an FET having triode-type dynamic characteristics which may be used in the amplifier shown in FIG. 1. The FET is a vertical junction structure formed of an intrinsic semiconductor region 100 having low impurity concentration and high resistance, a P-type semiconductor region 102 having an annular configuration and formed on the upper portion of the intrinsic region 100 and a N-type semiconductor region 103 having high impurity concentration formed over both the annular P-type region 102 and the intrinsic region 100, as shown. The P-type region 102 may be formed by conventional selective diffusion techniques and the N-type region 103 may be formed by conventional epitaxial techniques. Of course, other methods can be used to form these regions, as desired. Respective drain D, gate G and source S electrodes are provided at the lower surface of the intrinsic region 100, an exposed portion of the P-type annular region 102 and the upper surface of the N-type region 103, respectively.

The vertical junction FET depicted in FIG. 2 exhibits triode-type dynamic characteristics. A preferred embodiment of such an FET is depicted in FIG. 3 wherein like reference numerals identify corresponding elements. The FIG. 3 embodiment may be thought of as being formed by a combination of plural FET's of the type shown in FIG. 2 and closely resembles the aforedescribed FIG. 2 embodiment of the FET with the added modifications that the P-type annular region 102 is formed with a mesh-type structure therewithin, as shown. Accordingly, the high impurity concentration N-type region 103 is seen to overlie both the annular and mesh-shape P-type region 102 and the intrinsic region 100, the mesh-shape defining a boundary between the intrinsic region and the overlying high impurity concentration N-type region. Furthermore, an additional N-type semiconductor region 104 having high impurity concentration is formed on the lower surface of the intrinsic semiconductor region 100 and the drain electrode D is formed thereon. The additional N-type region serves to increase the breakdown voltage between the drain and source electrodes.

The equivalent internal resistance between the source and drain electrodes is a composite resistance comprised of the resistance between the source electrode and the channel within the FET, the resistance of the channel itself and the resistance between the channel and the drain electrode. In the prior art junction FET, the channel is a lateral channel having high resistance because of its narrow and long configuration. The source-to-channel resistance and the channel-to-drain resistance also are high. Consequently, the resistance of the prior art junction FET is very high. As a result of this high resistance, the prior art junction FET exhibits pentode-type dynamic characteristics and, as is apparent therefrom, the drain current becomes saturated as the drain voltage is increased.

In comparison to the aforedescribed prior art junction FET, the FET shown in FIGS. 2 and 3 is characterized by a relatively small separation between the source electrode S and the vertical junction and, additionally, the channel length itself is relatively small so that the ratio of channel width to length is larger than that of the prior art lateral channel FET. Consequently, the output resistance of the vertical junction FET depicted in FIGS. 2 and 3 is much smaller than the resistance of the prior art FET and is on the order of, for example, about 10 ohms. Accordingly, the drain current of the illustrated FET does not become saturated as the drain voltage increases. The voltage-current characteristics with respect to the drain electrode thus exhibit superior linearity over those of the prior art, thereby permitting effective use of the FET in an amplifier with high signal fidelity.

An illustration of the dynamic characteristics exhibited by the FET shown in FIGS. 2 and 3 is graphically represented in FIG. 4. This graphical representation depicts the relationship between the drain current $I_D$ and the drain voltage $V_D$. Each individual curve represents the current-voltage relationship for corresponding gate voltages $V_G$ wherein the gate voltage is the variable parameter from, for example, 0V to $-24$V. It is recognized that the characteristic curves shown in FIG. 4 are analogous to the curves which represent the dynamic characteristics of a conventional triode. Therefore, because the FET is of the type which exhibits triode-type dynamic characteristics, the output resistance is substantially constant and the FET is capable of producing a large output signal having little distortion.

Among the advantages attained by the use of the illustrated FET having triode-type dynamic characteristics is that the larger ratio of vertical channel width to channel length between the drain and source regions permits a higher drain current to flow. Another advantage is that the characteristic curves depicting the relationship between drain current and gate voltage are linear so that odd harmonic distortion is reduced. Yet another advantage is the reduction in switching distortion which is attributed to the fact that the FET does not have the storage carriers which are included in bipolar transistors. Still another advantage is the high input impedance of the FET. As a result of such input impedance, the load presented by an input source does not cause non-linear distortion. Yet a further advantage lies in the fact that, because of its low output resistance, the illustrated FET can readily drive a load which requires a relatively high damping factor. An additional advantage is that if the illustrated FET is used in a push-pull amplifier, a complementary push-pull circuit can be formed of simple circuit construction.

Referring again to FIG. 1, the operation of the schematically illustrated amplifier now will be described. An input signal applied to the input terminal 4 which, for example, may be an audio signal, is amplified by the differential amplifiers 7 and 8 included in the input stage 1. The resultant amplified signal is provided across the resistor 13 and is supplied in complementary form to the complementary transistor devices 18a and 18b. Consequently, these transistor devices are alternately rendered conductive and nonconductive. That is, when a sinusoidal signal is considered, the transistor device 18a will be rendered conductive during one-half cycle while the transistor 18b is cut off during that half-cycle. During the next half-cycle, the transistor device 18a is cut off and the transistor device 18b is conducting. Hence, these transistor devices may be considered to be driven in alternate, opposite phases.

After amplification, the signals are supplied by the respective transistors devices 18a and 18b to the FET's 20a and 20b, respectively. Since the FET's are connected in Class-B or Class-AB complementary push-pull configuration, and since the transistor devices 18a and 18b are alternately driven, it is appreciated that the FET's likewise are driven in complementary symmetry so as to be alternately rendered conductive and non-conductive. Thus, the input signal which is applied to the input terminal 4 is effectively power amplified and is supplied to the load 6 with substantially no distortion.

Since the FET's 20a and 20b are driven alternately to their conductive and nonconductive states, it is appreciated that, during each half-cycle of an input sinusoidal signal, one or the other FET is cut off. When cut off, the gate leakage current is caused to flow. However, because of the respective constant current circuits 23a and 23b which are connected as the emitter loads for the respective transistor devices 18a and 18b, the gate leakage current is limited. That is, the constant current circuits limit the gate leakage current to a predetermined value. That is, because the transistor devices 18a and 18b are connected as emitter-followers, the gate leakage current for each of the FET's 20a and 20b is limited so that it cannot exceed the predetermined constant current value established by the constant current circuits 23a and 23b. Consequently, because this gate leakage current is so limited, the gate voltage for each FET during cut off likewise is limited, and is held constant. Therefore, it is readily appreciated that the gate leakage current cannot increase; nor can the gate voltage rise to a value which might damage of even destroy the FET, as has occurred in prior art amplifiers.

Another embodiment of the present invention now will be described with reference to FIG. 5. This FIG. 5 embodiment also is comprised of an input stage 1, a drive stage 2 and a direct coupled output stage 3. As in the FIG. 1 embodiment, the output stage 3 of the presently described amplifier is formed of complementary FET's 20a and 20b which are connected in Class-B or Class-AB complementary push-pull amplifier configuration to a load 6 through an output terminal 5. These FET's were connected in source-follower configuration in FIG. 1; and in FIG. 5 they are shown in common source or drain-follower configuration.

The drive stage 2 of FIG. 5 is comprised of complementary transistor devices 18a and 18b which are direct coupled to the FET's 20a and 20b, respectively, in emitter-follower configuration. As in the FIG. 1 embodiment, each of these transistor devices is provided with a constant current circuit 23a and 23b, respectively, as the emitter load. In addition, the drive stage 2 now includes an additional stage of amplification provided by the complementary amplifying transistors 31a and 31b, respectively. More particularly, the amplifying transistor 31a is connected so that its base electrode is adapted to receive the input signal, to amplify same and to supply the amplified signal to the transistor device 18a via the collector electrode of the transistor 31a. The transistor 31a additionally is provided with an operating voltage by connecting its collector electrode through a load resistor 32a to the positive terminal $+B_2$ of the second DC supply. The emitter electrode is connected through an emitter resistor 33a to the output terminal 5, and the voltage developed at this output terminal is fed back to the input stage 1, as will be described.

In a similar circuit configuration, the amplifying transistor 31b is adapted to receive the input signal supplied from the input stage 1, to amplify same and to supply this amplified signal via its collector electrode to the transistor 18b. Operating potential is supplied to the transistor 31b by connecting its collector electrode through a collector load resistor 32b to the negative terminal $-B_2$ of the second DC supply. The emitter electrode of the transistor 31b is connected through an emitter resistor 33b to the output terminal 5.

The input stage 1 is a Class-A amplifier and is comprised of a differential amplifier 8' formed of differentially-connected transistors 37 and 38, as shown. A signal applied to the input terminal 4 is supplied through a voltage divider formed of the resistors 35 and 36 to the transistor 37. The transistor 38 is adapted to receive a portion of the output voltage which is fed back thereto by a negative feedback circuit formed of the series-connected resistors 54 and 49. These resistors are disposed in voltage divider configuration and, in addition, a capacitor 48 is included in this circuit. The transistors 37 and 38 are supplied with an operating potential from the first DC supply and, as illustrated, the collector electrode of the transistor 37 is connected through a resistor 39 to the negative terminal $-B_1$ of the first DC supply, whereas the collector electrode of the transistor 38 is connected directly to this negative terminal. The common-connected emitters of the differentially-connected transistors 37 and 38 are connected to a constant current circuit formed of a transistor 43 whose base electrode is provided with a substantially constant base bias voltage derived from the bias circuit comprised of diodes 45 and 46 and a resistor 47. This bias circuit is connected to the positive terminal $+B_1$ of the first DC supply and the diodes are poled such that current flows from this DC supply through the diodes and through the resistor 47 to a reference potential, such as ground. The emitter electrode of the constant current transistor 43 is connected through a resistor 44 to this positive terminal $+B_1$. As is appreciated, the substantially constant voltage derived from the forward bias drop across the series-connected diodes 45 and 46 is supplied as the base bias voltage for the constant current transistor 43.

The output voltage produced by the differential amplifier 8' is derived from the collector electrode of the transistor 37 and is adapted to be supplied to the complementary amplifier transistors 31a and 31b, included in the drive stage 2, by a transistor 41. As illustrated, the transistor 41 is capable of receiving the amplified signal produced by the differential amplifier 8', and the emitter electrode of this transistor is connected through a resistor 42 to the negative terminal $-B_1$ of the first DC supply. The collector electrode of this transistor 41 is connected through a bias circuit to the complementary amplifier transistors 31a and 31b.

The bias network is comprised of a string of series-connected diodes 55, 56 and 57 which interconnect the collector electrode of the transistor 41 with the positive terminal $+B_1$ of the first DC supply through a resistor 40. It may be appreciated that these diodes are poled such that a reference voltage is provided thereacross. A capacitor 50 is connected in parallel with the diodes 55-57 to provide an AC bypass in shunt relation therewith. A resistor 51 serves to couple one end of the bias network to the base electrode of the amplifier transistor 31a, and a similar resistor 58 serves to couple the other end of the bias network to the base electrode of the amplifier transistor 31b. A variable resistor 53, such as a potentiometer, rheostat, or the like, in series with a resistor 52, interconnects the respective base electrodes of the amplifier transistors 31a and 31b and permits an adjustment to the input bias potentials supplied to the drive stage 2.

Another difference between the embodiment shown in FIG. 5 and the embodiment of FIG. 1 is that the operating potentials which are supplied to the complementary transistor devices 18a and 18b are derived from the second DC supply. Accordingly, as illustrated, the collector electrode of the transistor device 18a is connected to the positive terminal $+B_2$ of the second DC supply; and the collector electrode of the transistor device 18b is connected to the negative terminal $-B_2$ of the second DC supply. Preferably, the magnitude of the voltage produced by the first DC supply is equal to $V_1$ and is less than the magnitude of the voltage $V_2$ which is produced by the second DC supply. That is, the magnitude of the voltages which are provided at the positive and negative terminals of the first DC supply are equal, but are of opposite polarity. Similarly, the voltages which are provided at the positive and negative terminals of the second DC supply are equal but are of opposite polarity and, moreover, are greater than the voltage $V_1$. Furthermore, although not shown, the respective voltages $+V_1, -V_1, +V_2$ and $-V_2$ are stabilized. To this effect, conventional voltage regulating circuits can be provided in the respective DC supplies.

If it is assumed that the diodes 55, 56 and 57 included in the bias network produce a reference voltage such that the bias voltage applied across the base electrodes of the complementary amplifier transistors 31a and 31b is equal to $V_a$, and if the base-emitter voltage for each of these transistors, when conductive, is equal to $V_{BE}$, and if the respective resistance values of the emitter resistors 33a and 33b are equal to $R_a$ and $R_b$, then the emitter current for the transistor 31a is equal to the emitter current for the transistor 31b and is expressed as $(V_a-2V_{BE})/(R_a+R_b)$. Assuming that these transistors exhibit negligible base current, this emitter current is substantially equal to the transistor collector current. This collector-emitter current for the transistors 31a and 31b is attributed to the bias voltage applied across the respective base electrodes by the illustrated bias network, and represents the collector-emitter current when no input signal is applied to the input terminal 4. It is appreciated that this bias current is dependent upon the reference voltage $V_a$ which may be adjusted, as desired, merely by adjusting the variable resistor 53. This, of course, serves to correspondingly change the bias voltage to the drive stage 2 and to the output stage 3 of the illustrated amplifier.

Since the drive stage 2 is connected in complementary symmetry to drive the FET's 20a and 20b in complementary push-pull configuration, it is appreciated that an input signal which is applied to the input terminal 4 and which is amplified by the differentially-connected transistors 37 and 38 and by the transistor 41, and is further amplified by the transistors 31a, 18a and 31b, 18b, will drive the FET's such that they are alternately conductive and cut off, depending upon the sinusoidal half-cycle of the input signal. As was described previously with respect to the embodiment of FIG. 1, the constant current circuits 23a and 23b serve to limit the gate leakage current of the nonconductive FET's to a predetermined maximum.

The reason for supplying the operating potentials to the drive stage 2 and to the output stage 3 from separate DC supplies now will be explained. In the drain-follower, or common source, configuration, shown in FIG. 5, the drain current for each of the FET's 20a and 20b is relatively large in order to power amplify the input signal. Therefore, it is recognized that if the drive stage and the output stage were to be supplied by a single DC supply, the power supply requirements for that single DC supply would be quite large. In fact, the necessary DC supply that would have to be constructed would be so large as to be economically prohibitive. In addition, if the FET's are constructed as vertical junction FET's having triode-type dynamic characteristics, as shown in FIGS. 2 and 3, these FET's would require a highly stable operating voltage, thus making a single DC supply even more costly.

For the foregoing reasons, it is preferred to use two individual DC supplies, each having reasonable power supply capacities and each being of relatively simple and economical construction. That is, it is less costly to construct individual power supplies for the drive stage and for the output stage than to design and construct a single DC supply which would have to be capable of energizing both stages.

Another reason for providing separate DC supplies for the drive stage and for the output stage is that the maximum gate-source voltage can be limited to a relatively low value, whereas the DC supply voltages $V_1$ and $V_2$ can be sufficiently high. This obtains when it is considered that the maximum gate-source voltage will be present when the power supplies first are energized, or switched on. At that time, one of the FET's may be considered to be cut off and one of the complementary transistor devices 18a and 18b also may be cut off. If the FET 20a is considered, it may be possible that its gate voltage is equal to $V_2$ while its source voltage is equal to $V_1$. Hence, the maximum gate-source voltage cannot exceed $V_1-V_2$. With this limitation, the voltage $V_1$ which is provided at the positive or negative terminal of the first DC supply can readily be of sufficient magnitude so that the gain of the drive stage 2 is enhanced. Furthermore, not only is the gain of the entire illustrated amplifier enhanced, but sufficient negative feedback can be provided, if desired. Accordingly, distortion of the signals applied to the load 6 can be reduced substantially to zero.

While the present invention has been described in detail with reference to preferred embodiments thereof, it will be readily apparent that various changes and modifications in form and details can be made without departing from the spirit and scope of the invention. For example, while it is preferred that the FET's 20a and 20b be vertical junction field effect transistors having triode-type dynamic characteristics, it is envisaged that the present invention will operate satisfactorily with conventional junction field effect transistors having pentode-type dynamic characteristics. Also, MOSFETs can be used as these devices.

The aspect of providing a constant current circuit as the load for the transistor device which is direct coupled to the FET so as to limit the gate leakage current of the FET during cut off and to prevent the FET from being induced to its conducting state can be utilized when only a single FET is used. Hence, the complementary push-pull configuration can be replaced by other conventional amplifier configurations. That is, one of the complementary FET's in the output stage of the illustrated embodiments and one of the complementary transistor devices in the drive stage can be omitted.

Therefore, it is intended that the appended claims be interpreted as including the foregoing as well as various other modifications and changes.

What is claimed is:

1. An amplifier including a drive stage and an output stage, comprising:
   a field effect transistor included in said output stage, one of the source and drain electrodes being connected to an output load and the other of said electrodes being supplied with an operating voltage;
   transistor emitter-follower means included in said drive stage having a control electrode supplied with a signal to be amplified and an emitter electrode direct coupled to the gate electrode of said field effect transistor; and
   means for limiting the gate leakage current of said field effect transistor including constant current means coupled as a load to said emitter electrode of said transistor means for providing a current of predetermined magnitude, said constant current means also being coupled to said gate electrode of said field effect transistor.

2. An amplifier in accordance with claim 1 wherein said constant current means comprises additional transistor means having a control electrode supplied with a constant bias voltage and having first and second output electrodes connected in series with the first and second output electrodes of said transistor means; and bias means coupled to the control electrode of said additional transistor means for supplying said constant bias voltage thereto.

3. An amplifier in accordance with claim 1 further comprising means for supplying the same operating voltage to said field effect transistor and to said transistor means.

4. An amplifier in accordance with claim 3 wherein said last-mentioned means includes a resistor for supplying said operating voltage to said other electrode of said transistor means.

5. An amplifier in accordance with claim 1 wherein the operating voltage supplied to said transistor means is greater than the operating voltage supplied to said field effect transistor.

6. An amplifier in accordance with claim 5 wherein said drive stage further includes a second transistor for receiving an input signal and for supplying same to said base electrode in said transistor emitter-follower means.

7. An amplifier in accordance with claim 6 wherein said field effect transistor is connected to said output load in drain-follower configuration.

8. An amplifier in accordance with claim 6 further comprising biasing means coupled to said second transistor for supplying a predetermined base bias voltage thereto.

9. An amplifier in accordance with claim 1 wherein said field effect transistor is a vertical junction field effect transistor having triode-type dynamic characteristics.

10. An amplifier in accordance with claim 9 wherein said field effect transistor is formed of an intrinsic semiconductor region having an overlying annular semiconductor region of one conductivity type comprising the gate region; and a further overlying semiconductor region of an opposite conductivity type comprising the source region.

11. An amplifier in accordance with claim 1 wherein said output stage includes a second field effect transistor connected to said output load such that the first and second field effect transistors are connected to said output load in push-pull relation; and said drive stage includes second transistor emitter-follower means having a control electrode supplied with a signal to be amplified and an emitter electrode direct coupled to the gate electrode of said second field effect transistor and, additionally, to second constant current means, said second constant current means being coupled as a load to said emitter electrode of said second transistor emitter-follower means and also to said gate electrode of said second field effect transistor to limit the gate leakage current of the latter.

12. An amplifier in accordance with claim 11 wherein said first and second field effect transistors are complementary; and wherein said first and second transistor emitter-follower means comprise first and second complementary transistors driven in complementary relation by an input signal.

13. An amplifier, comprising:
   an input stage for receiving an input signal and for providing complementary output signals in response thereto;
   a drive stage coupled to said input stage for receiving said complementary output signals and including first transistor means having an input electrode to which one of said complementary output signals is applied and having output electrodes; said drive stage further including second transistor means having an input electrode to which the other of said complementary output signals is applied and having output electrodes;
   an output stage including first and second field effect transistors, the gate electrode of said first field effect transistor being direct coupled to one of the output electrodes of said first transistor means and the gate electrode of said second field effect transistor being direct coupled to one of the output electrodes of said second transistor means, one of the source and drain electrodes of each of said field effect transistor being coupled to an output load; and first and second constant current sources connected as respective loads to said one output electrode of said first and second transistor means, respectively, and also to said gate electrode of said first and second field effect transistors, respectively, to limit the respective gate leakage currents of said first and second field effect transistors.

14. An amplifier in accordance with claim 13 wherein said first and second field effect transistors are connected to said output load in complementary push-pull relation.

15. An amplifier in accordance with claim 14 wherein said first and second transistor means include first and second transistors, respectively, direct coupled to said first and second field effect transistors in emitter-follower configuration.

16. An amplifier in accordance with claim 15 wherein said input stage comprises differential amplifier means for producing said complementary output signals to alternately drive said first and second transistors.

17. An amplifier in accordance with claim 16 further comprising power supply means for supplying operating voltages to said first and second field effect transistors and to said first and second transistors.

18. An amplifier in accordance with claim 17 wherein said first and second field effect transistors are connected to said output load in source-follower configuration; and said power supply means comprises means for applying the same operating voltages across the first and second field effect transistors and across the first and second transistors.

19. An amplifier in accordance with claim 17 wherein said first and second field effect transistors are connected to said output load in common source configuration; and said power supply means comprises means for applying higher operating voltages across the first and second transistors than across the first and second field effect transistors.

20. An amplifier in accordance with claim 15 wherein said first transistor means further includes a first additional transistor for receiving one of said complementary output signals and for applying same to said first transistor; and said second transistor means further includes a second additional transistor for receiving the other of said complementary output signals and for applying same to said second transistor.

21. An amplifier in accordance with claim 20 further comprising a bias circuit connected between the respective base electrodes of said first and second additional transistors for applying an adjustable bias voltage to said first and second additional transistors.

22. An amplifier in accordance with claim 15 wherein said first and second constant current sources limit the respective gate leakage currents of said first and second field effect transistors during respective periods that each field effect transistor is cut off to a predetermined level, each said constant current source comprising a further transistor having its base electrode supplied with a constant bias voltage and having its collector-emitter circuit connected in series with the emitter electrode of a corresponding one of said first and second transistors; and a constant bias source coupled to said base electrode of said further transistor for supplying said constant bias voltage thereto.

* * * * *